United States Patent [19]

Bumgardner

[11] 4,037,162
[45] July 19, 1977

[54] PSEUDO SAMPLING

[75] Inventor: Jon H. Bumgardner, Ridgecrest, Calif.

[73] Assignee: The United States of America as represented by the Secretary of the Navy, Washington, D.C.

[21] Appl. No.: 581,258

[22] Filed: May 27, 1975

[51] Int. Cl.$^2$ .............................................. H03K 5/00
[52] U.S. Cl. ................................... 328/151; 307/229; 328/162; 307/352
[58] Field of Search ........ 328/150, 151, 130, 162–163; 307/230, 242, 251, 229, 235 B

[56] References Cited

U.S. PATENT DOCUMENTS

| 3,531,802 | 9/1970 | Brown et al. | 328/151 X |
| 3,732,411 | 5/1973 | Galeener | 328/151 X |
| 3,792,195 | 2/1974 | Wilson et al. | 328/151 X |

Primary Examiner—John Zazworsky
Attorney, Agent, or Firm—R. S. Sciascia; Roy Miller

[57] ABSTRACT

A technique for effectively sampling continuous signals including signals of rapid, sharp pulses, by interrogating discrete portions of the signal through integration rather than by conventional samples.

8 Claims, 3 Drawing Figures

PSEUDO SAMPLING

CROSS-REFERENCE TO RELATED APPLICATION

U.S. Pat. application Ser. No. 495,473, filed Aug. 7, 1974 by the present inventor, (now U.S. Pat. No. 3,903,432, issued Sept. 2, 1975).

BACKGROUND OF THE INVENTION

In the field of pattern recognition some signal sources provide too much information too rapidlyy for conventional components to be employed with traditional sampling techniques. The result is, either much information is missed or distorted, or special expensive electronics must be created to do the necessary high speed sampling on the signal of interest. Even in the latter case the sensitivity and sampling rate necessary for some rapidly changing signals is too great for presently known techniques. One such application resides in the preparation of certain radar and laser pulse signals by digitizing for pattern recognition.

The present invention provides an inexpensive, relatively simple technique for pseudo sampling a signal. The present invention approximates sampling by separately integrating successive discrete portions of the signal. The resultant series of values describe the signal as fully as would any conventional technique (even if one were able to handle the rapid rate pulses for which the present invention is particularly effective). And, the present invention can be employed at less cost and complexity than previous techniques.

A basic difference between prior techniques and the technique of the present invention is that conventional samplers assume that each sample is taken during an infintely short time, whereas the technique of the present invention interrogates the signal for a finite time per sample. In conventional sampling techniques an approximation is invariably employed to compensate for the inaccuracy necessarily resulting from the assumption, as all samples require a finite time for taking.

DESCRIPTON OF THE PREFERRED EMBODIMENT

Figure 1:
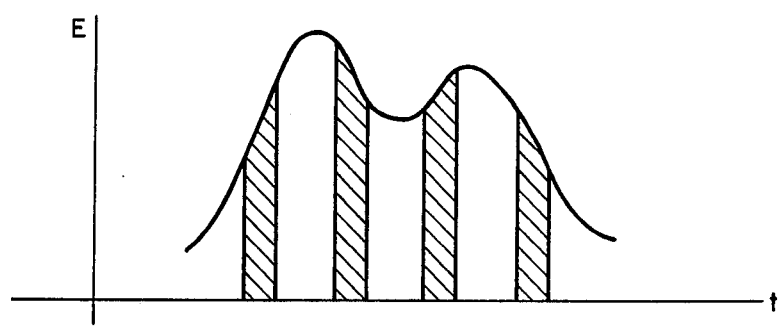
FIG. 1 is a waveform graph symbolically indicating the technique of the present invention.

Previously, signals were interrogated by sampling wherein conventional Dirac samples were taken sequentially to measure the wave shape and signal value of the information received. For such systems the well known Nyquist sampling criteria must be met for system stability, which necessarily limits the bandwidth of the circuit that can be employed. The present invention avoids these restrictions by pseudo sampling the signal rather than by taking a true sample thereof. The present invention was arrived at when an effort was undertaken to provide a high speed sampler wherein the bandwidth of the signal processor can be increased so that very fast transitions between "off-on-off" switching could be used. Transitions of a few hundred picoseconds and sampling rates of 350 megahertz, and higher, can be obtained. Even for high speed sampling the fastest sample rate normally required will be no more than 3 to 4 nanoseconds between consecutive data points. Transition time of 150 picoseconds is a time spread of only 5%, wherein time spread is the delay between the time the integrator starts to turn on (or off) and the time it is capable of completing integration of the signal instantaneously. The same is also true of sampler gates.

Sampling signals of frequencies higher than two times the reciprocal of the sampling interval lead to errors in the output, errors which appear to fold back into the spectrum below $2/T$ hertz, where $T$ is the period of the sampler. In pseudo-sampling, however, the error effect is attenuated. The higher the frequency the higher the attenuation. As a result, higher noise frequencies may be processed by the pseudo-sampling technique than may be processed by the true sampling technique.

As does true sampling, pseudo- has a 1:1 relationship between time domain signals, their corresponding integral coefficients, and back again to the time domain. As a result, pseudo-samplng may be used to replace sampling in all applications. And, in view of the superior high frequency attenuation properties of pseudo-sampling it has the advantage of being able to obtain pseudo-sampling rates, or integration rates, of beyond several hundred megahertz. Since integration is a linear process no harmonics will be generated by pseudo-sampling, i.e. integration.

In the present invention, no attempt is made to measure the value of the signal instantaneously, as is unsuccessfully attempted in conventional Dirac sampling. Rather, the restraints placed on conventional sampling processes by the limitations of available hardware is accepted by the present invention. Basically, the present invention recognizes that sampling requires a sample period of finite duration, employs conventional sampling techniques to obtain samples, and modifies the samples obtained by compensating for attenuation. Relative attenuation has been discovered by the present inventor to be a function of the input signal frequency and the duration of the sample period, as discussed below.

Attenuation is inherent when the signal varies significantly during the sample period, as is the case when rapidly changing signals are sampled by conventional techniques. And, therein is the arena of primary advantages for the present invention. It allows less expensive hardware to be used on higher freqency inputs, and extends the capabilities of all available sampling techniques and hardware.

FIG. 1 graphically depicts the technique of the present invention. A signal to be interrogated is processed by successive integration rather than conventional Dirac sampling. Successive integrations are depicted by the cross-hatched portions of FIG. 1, having some finite width and most probably equally spaced. The technique differs from conventional sampling in that an area of finite width under the waveform is integrated instead of attempting to instantaneously sample a value of the the waveform.

The following analysis is provided for the reader to develop an understanding of the technique of the present invention. If a cosine waveform is considered, a true sample of signal voltage will be $+1$. $V_s$ is voltage of sample. The expected value of the magnitude $|V_s|$ which is the average value of the magnitude $V_s$ is $2/\pi$ by integration since absolute value of maximum $V_s = +$ 1. It is assumed $\theta$ is a random variable between $-\pi/2$ and $+3\pi/2$.

The result of pseudo-sampling the cosine waveform, with integration starting at $-\Pi/2$ and stopping at $+\Pi/2$, will be merely $|V_s|$, as above, or $2/\Pi$. It therefor follows that if we let the midpoint of the pseudo-sample take on any angle $\theta$ over the interval zero to $2\pi$, the absolute value of maximum pseudo sample voltage, $|V_{PS}|$, will be $(2/\Pi)^2$ since the voltage of the pseudo-sample, $V_{PS}$, describes an attenuated cosine wave. The conclusion is that if we normalize the pseudo sample values to the true sample value we obtain the response characterics shown in FIG. 2. The true sample has a flat system gain over the entire zero hertz to $\frac{1}{2}$ sample frequency, $F_N$, interval. By normalizing the frequency axis so that $F_N$ becomes 1, $V_{PS}/V_S$ can be measured as a function of frequency. That is, $V_{PS}/V_S = f(F_N/F_N)$. By taking the average of the integral of a cosine wave from $-\Pi/2$ to $+\Pi/2$, which is the area under the cosine curve divided by the baseline (or time t) distance, pseudo-sampling attenuation relative to true sampling at $F_N$ is $2/\Pi$. Solving the integral for various baseline distances with respect to a full $\Pi$ radians is equivalent to varying the input signal frequency $f_N$ with respect to one-half the Nyquist frequency $(F_N)$.

Because the cosine waveform is symmetrical around time $T=0$, the relative attenuation, $\alpha(f)$, can be solved by calculating the area under the waveform between $t = 0$ and $t_f$ and dividing by $t_f$ as follows:

$$\alpha(f) = \frac{\int_0^{t_f} \cos(t \frac{\Pi}{2}) dt}{t_f} = \frac{2}{\Pi f} \sin t \frac{\Pi}{2} \Big|_0^f$$

$$= \frac{2 \sin(f \frac{\Pi}{2})}{\Pi f}$$

where $= f_N =$ input frequency to pseudo sampler
where $= F_N = \frac{1}{2}$ Nyquis frequency
where $= \alpha(f) =$ normalized gain for an input frequency of $f_N$
$f =$ normalized input frequency, $f = f_N/F_N$
$t_f =$ the sample width or normalized integration time, $t_f = f_N/F_N$
To determine aliasing $\alpha$, let $f > 1$.

Figure 2:
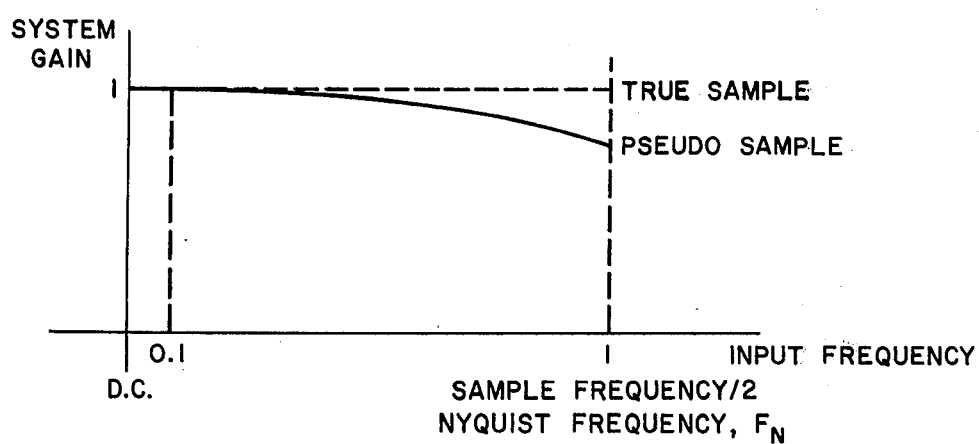
FIG. 2 is a graph showing the relative system gain of a true sampler and a pseudo-sampler over the frequency range from zero hertz to one-half the sample frequency.

FIG. 2 shows by example that the deviation a pseudo sampler will have from a true sampler can be predicted when the ideal impulse sampling function is frequency band limited to frequenies no higher than $f_N$. To find the relative attenuation that a pseudo-sampler will have compared to a true sampler first establish the frequency of interest $f_N$, and the actual width of the sampling gate $\tau$ assuming the gate output represents the area under the input curve over the sample time. Calculate $f$ from
$f = (f_N/F_N) = 2f_N \tau$
The attenuation of the frequency $f_N$ due to the finite gate width $\tau$ may be found from FIG. 2 or
$\alpha(f) = 2 \sin(f\Pi/2)/\Pi f$.
As an example, for the case $f = 0.1$ as shown in FIG. 2, $\alpha(f) = 0.9959$, which means that the error is less than $\frac{1}{2}\%$.

Pseudo-sampling relative attenuation is a function of only input frequency and integration gate width, and is completely independent of actual sampling rate. The use of 2 $F_N$ as the sample rate was chosen only as a convenient example that provides an upper limit to meaningful sampled data systems. The response of pseudo-sampling rates beyond $F_N$ monotonically decreases with increasing $f_N$ up to $f_N = 2F_N$.

Compensation for the relative attenuation may be made by computer, properly programmed to apply compensation based on the attenuation determined from the above relationship. Input frequency and sample gate width can be measured by known techniques and provided to the computer. The computer can be a processing system added to, or included in, the interrogator that examines the information provided by the samples, such as an analog-to-digital converter, or it can be inserted between the signal source and the sampler to condition the signal prior to sampling. In the alternative, compensation can be accomplished manually for each sample value.

Figure 3:
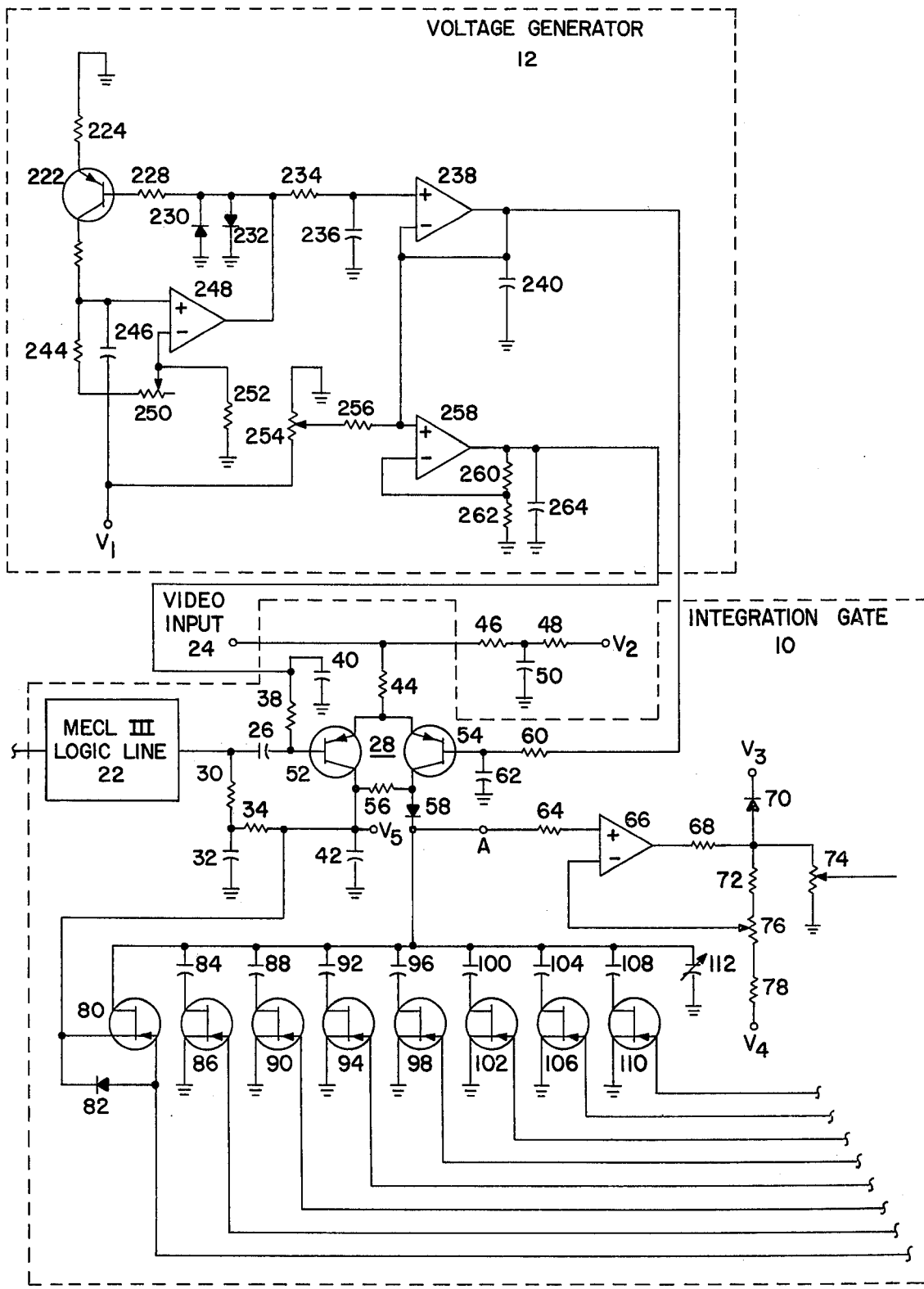
FIG. 3 is a schematic diagram of an operable circuit of a preferred embodiment of the present invention.

FIG. 3 shows one operable embodiment of a sampler that may be used in the present invention and is offered as an example of an implementation of the inventive concept. The circuit of FIG. 3 takes the sample that is thereafter processed to compensate for the inherent attenuation that results. Other available samplers may be employed in place of the circuit of FIG. 3.

The circuit (shown in FIG. 3) that will now be described is also shown in U.S. Pat. No. 3,903,432, filed Aug. 7, 1974 by the present inventor, and is entitled "Integration Gate". The input of integration gate 10 to be processed is presented at input 24 and integrated during the period Motorola Emitter Coupled Logic, third generation (MECL III) 22 is at a logic true. The electrical input coupled to input 24 is shown as a video input but is not so limited. Other inputs for other purposes wherein the signal to be integrated is coupled to input 24 and the integrating control signal is coupled to input 22 may be used.

During the period an input is coupled to input 22 transistor 52 of differential amplifier 28 is rendered nonconductive, causing transistor 54 to become conductive, which provides a current path for the input at input 24 to the integrating bank of capacitors 84, 88, 92, 96, 100, 104, 108 and 112. The integrated output which appears at A is coupled through the buffer and signal conditioner circuitry associated with operational amplifier 66 to the circuit's output taken at resistor 74.

Field effect transistors (FET) 86, 90, 94, 98, 102, 106 and 110 are individually coupled to voltage sources such that they can be selectively rendered conductive, coupling their respective capacitor into the circuit to integrate the input coupled to input 24. The integrating capacitors may each be different in capacitive value such that the capacitance coupled into the circuit can be selected by selectively gating its associated FET. Thereby, the integration gate gain will be selected. This gain is a function of desired integration period length. In the alternative, the capacitors may be identical and enabled successively, providing successive pseudo-samples of identical widths. It is advisable that only one FET be rendered conductive at a time per gate to avoid resonance wherein two or more of the parallel coupled capacitors would operate as a tank circuit.

FET 80 and diode 82 are included to reset differential amplifier 28 to its initial conductive state wherein transistor 52 is conductive during the period no input is received at input 22. Feedback from resistor 76 of the output circuitry is coupled to operational amplifier 66 as a zero adjust device to compensate for any nonzero value that might be seen at the output before the circuit is placed in operation by coupling the inputs thereto.

Reference voltage generator 12 is a temperature compensating voltage supply wherein the voltage at the base of transistor 54 is maintained equal to the voltage at the base of transistor 222 by the servo circuitry shown. In order to achieve this equality, resistor 224 of generator 12 is chosen to match resistor 44 of each integration gate 10 employed in the system. The purpose of the circuit is to automatically provide the voltage at the base of transistor 54 that is necessary to maintain the integration transistor bias level current at a preselected value. The exact current level is set by adjusting the variable resistor 250 which controls one of the inputs of operational amplifier 248. The circuit will then cause the value of the bias voltage at the base of transistor 54 to vary in such a manner as to keep the current level at the selected value independent of temperature changes. Variable resistor 254 is adjusted to select the amount of offest voltage the bias level coupled through resistor 38 to the base of transistor 52 has from the voltage bias level coupled to the base of transistor 54.

The voltage generator is designed so that all temperature changes result in no change in operating characteristics. Both voltages coupled from generator 12 to gate 10 change as required to keep the differential bias and operating current, and voltage values independent of temperature.

The following set of components and values form an operable embodiment of the present invention; but, are listed as an example only and should not be considered to limit the invention to the specifics shown. They were chosen by the designer for several parallel integration gates providing seven successive integration periods without system resetting, having a 50 ohm system input impedance from D.C. to above 100MH$_z$, and providing individual integration times of 25, 50, 100, 200, 400, 800 and 1600 nanoseconds, as desired.

| SYMBOL | COMPONENT | TYPE OR VALUE |
|---|---|---|
| 26 | capacitor | 0.1 μf |
| 28 | transistor | 2N4261 |
| 30 | resistor | 75 ohm |
| 32 | capacitor | 0.1 μf |
| 34 | resistor | 390 ohm |
| 38 | resistor | 150 ohm |
| 40 | capacitor | 0.1 μf |
| 42 | capacitor | 0.1 μf |
| 44 | resistor | 365 ohm (match R 224) |
| 46 | resistor | variable trim |
| 50 | capacitor | 0.1 μf |
| 52 & 54 | transistors | (see 28) |
| 56 | resistor | 10K ohm |
| 58 | diode | HPA 2510 (selected) |
| 60 | resistor | 10 ohm |
| 62 | capacitor | 0.1 μf |
| 64 | resistor | 1K ohm |
| 66 | operational amplifier | M501C |
| 68 | resistor | 3K ohm |
| 70 | diode | HPA 2800 |
| 72 | resistor | 10K ohm |
| 74 | resistor | 5K ohm |
| 76 | resistor | 500 cermet |
| 78 | resistor | 10K ohm |
| 80,86,90 94,98,102 106,110 | field effect transistor | 2N4391 |
| 82 | diode | HPA 2120 |
| 84 | capacitor | 130 pf |
| 88 | capacitor | 270 pf |
| 92 | capacitor | 510 pf |
| 96 | capacitor | 1 μf |
| 100 | capacitor | 2 μf |
| 104 | capacitor | 4.3 μf |
| 108 | capacitor | 8.2 μf |
| 112 | capacitor | 0.5–10 pf (trimmer) |
| 222 | transistor | 2N4261 (matched to 52-54) |
| 224 | resistor | 365 ohm (matched to R44) |
| 226 | resistor | 10K ohm |
| 228 | resistor | 10 ohm |
| 230 | diode | MPD 300 |
| 232 | diode | 1N4151 |
| 234 | resistor | 10K ohm |
| 236 | capacitor | 6.8 μf |
| 238 | operation amplifier | μA741 |
| 240 | capacitor | 68 μf (30v) |
| 246 | capacitor | 0.25 μf |
| 248 | operational amplifier | μA741 |
| 250 | resistor | 1K cermet |
| 252 | resistor | 4.99K |
| 254 | resistor | 500 ohm cermet |
| 256 | resistor | 1K cermet |
| 258 | operational amplifier | μ741 |
| 260 | resistor | 10K |
| 262 | resistor | 1K |
| 264 | capacitor | 68 μf (30v) |
| $V_1$ | voltage supplied | −5.2 volts, dc |
| $V_2$ | voltage supplied | +15 volts, dc |
| $V_3$ | voltage supplied | +5 volts, dc |
| $V_4$ | voltage supplied | −10 volts, dc |
| $V_5$ | voltage supplied | −5 volts, dc |

The present invention operates as follows:

The input at input 22 is a digital level. Since the quiescent 0 and 1 levels vary as a function of temperature the logic level swings (changes only) are coupled into the base of transistor 52. The threshold voltage level coupled from generator 12 to the base of transistor 52 is chosen sufficiently below that of the bias voltage coupled to the base of transistor 54 to cause the design maximum leakage current to flow from transistor 54 without logic 0 on transistor 52 of each gate. Also, the bias voltage on the base of transistor 54 varies with temperature to keep the current source leakage current at a specified designed value in order to maintain linear operation of the current source transistor (transistor 54) when gating transistor 52 receives a 1 from logic input 22, which input renders transistor 54 conductive.

When transistor 54 is rendered conductive the signal appearing at input 24 is coupled to the selectively activated capacitor of the integrating capacitor bank described above. The value of the capacitor which has been electively activated determines the integration gate gain and allowable period.

Additional gates 10 may be parallel coupled to input 24, and to consecutive outputs from such as MECL 111 digital logic pulses. Thereby, each gate employed integrates a portion of the input received at input 24 as it is enabled by a digital input, wherein successive gates integrate successive portions of the input. Generator 12 is a temperature tracking voltage source which maintains the operating characteristics discussed above as the temperature varies.

To those skilled in the art it will be obvious upon a study of this disclosure that the present invention permits a variety of modifications and hence can be given embodiments other than particularly illustrated and described herein, without departing from the essential features of the invention and within the scope of the claims annexed hereto.

What is claimed is:

1. In a system for sampling an electrical signal as a means for interrogating it, the improvement of pseudo-sampling said signal by sampling the value of it at discrete portions of finite width instead of instantaneously sampling said signal at discrete portions of infinitely narrow width, and by compensating the sampled value with an attenuation figure to obtain the true signal value comprising;

means for sampling the value of said signal wherein the sample period is of finite duration, and providing a separate result for each portion sampled;

means for modifying each said result by compensating for relative attenuation induced by the utilization of said sample means, wherein said relative attenuation is given by $\alpha(f) = 2 \sin(f\pi/2)/\pi f$, and wherein $f$ is twice the frequency of the signal sampled times the duration of the sample period;

such that the modified results can be investigated as a means for interrogating said signal.

2. The system of claim 1 wherein said sampling and providing means includes electronic means for selectively enabling said sampling means such that successive, discrete portions of said signal are separately integrated.

3. The system of claim 2 wherein said sampling and providing means further includes means for providing first and second currents paths for said signal, wherein said first path is normally conductive and prevents sampling of portions conducted thereby, and said second path is normally non-conductive and rendered conductive by an output from said sampling enabling means which disables said first path and renders it non-conductive.

4. The system of claim 3 wherein said sampling and providing means further includes a bank of storage means coupled to said second path for integrating that which is conducted by said second path, and providing the result as an output value wherein each of said storage means is selectively and separately enabled electrically.

5. The system of claim 4 wherein a separate transistor is electrically in series with each storage means for enabling said storage means when said transistor is rendered conductive.

6. The system of claim 5 wherein said means for selectively enabling said sampling and providing means is a MECL III logic line coupled to said first current path for disabling said first path when said MECL III provides an output.

7. The system of claim 6 wherein said means for providing first and second current paths is a differential amplifier employing a 2N4261 transistor.

8. The system of claim 7 wherein said bank of storage means is a bank of identical capacitors, and the separate transistors in series with each capacitor are identical field effect transistors.

* * * * *